United States Patent [19]

Otsuki et al.

[11] Patent Number: 4,889,493

[45] Date of Patent: Dec. 26, 1989

[54] METHOD OF MANUFACTURING THE SUBSTRATE OF GAAS COMPOUND SEMICONDUCTOR

[75] Inventors: Yasuo Otsuki; Yoshio Nakamura, both of Yokohama, Japan

[73] Assignee: The Furukawa Electric Co., Ltd., Tokyo, Japan

[21] Appl. No.: 229,993

[22] Filed: Aug. 9, 1988

[30] Foreign Application Priority Data

Aug. 13, 1987 [JP] Japan .................................. 62-202223

[51] Int. Cl.$^4$ .................... C30B 15/00; C30B 33/00; H01L 21/265
[52] U.S. Cl. .................................. 437/265; 437/247; 437/248; 437/939
[58] Field of Search ................ 437/247, 248, 939, 245

[56] References Cited

U.S. PATENT DOCUMENTS

| | | | |
|---|---|---|---|
| 3,620,850 | 11/1971 | Deal et al. | 437/247 |
| 3,729,348 | 4/1973 | Saul | 437/248 |
| 3,737,282 | 6/1973 | Hearn et al. | 437/247 |
| 4,344,815 | 8/1982 | Cazarra et al. | 437/247 |
| 4,636,280 | 1/1987 | Nakai et al. | 437/248 |
| 4,713,354 | 12/1987 | Egawa et al. | 437/939 |
| 4,752,592 | 6/1988 | Tamusa et al. | 437/939 |

FOREIGN PATENT DOCUMENTS

| | | | |
|---|---|---|---|
| 0158431 | 7/1981 | Japan | 437/939 |
| 2137524 | 10/1984 | United Kingdom | 437/248 |

Primary Examiner—Brian E. Hearn
Assistant Examiner—Tuan Nguyen
Attorney, Agent, or Firm—Oblon, Spivak, McClelland, Maier & Neustadt

[57] ABSTRACT

A method of manufacturing a substrate of a GaAs compound semiconductor is disclosed, which is characterized in that, after a crystal of GaAs compound semiconductor obtained by the liquid encapsulated Czochralski method is annealed in the form of ingot, gradually cooled to room temperature and cut off in the form of a wafer, a re-heating treatment consisting of heating to a temperature of not lower than 700° C., rapid cooling from the temperature of not lower than 700° C. to a temperature of not higher than 400° C. within 30 minutes and successive cooling to room temperature is given to the wafer, and then mirror polishing is performed.

3 Claims, 3 Drawing Sheets

METHOD OF MANUFACTURING THE SUBSTRATE OF GAAS COMPOUND SEMICONDUCTOR

BACKGROUND OF THE INVENTION

The present invention relates to a method of manufacturing the substrate of GaAs compound semiconductor, in particular, to the method of manufacturing semi-insulating GaAs substrate in which the distribution of characteristics is uniform and which has high resistivity.

GaAs has a high electron mobility among the compound semiconductors of III-V groups and is being used broadly as a crystal substrate for of ultra high-speed integrated circuits and optoelectronic integrated circuits. This GaAs substrate is usually manufactured from a ingot obtained by the liquid encapsulated Czochralski method (hereinafter abbreviated as LEC method). However, the GaAs substrate made by LEC method has generally a large distribution of characteristics in the substrate (Japanese Journal of Applied Physics, vol. 21, No. 6, '82, p. L335–L337). For making the distribution of characteristics uniform, the ingot-annealing method wherein heat treatment at high temperature for a long time (800°–1100° C.×2–48 hours) is given to the GaAs single crystal in the form of ingot is broadly put into practice (GaAs IC Wymposium, '83 IEEE, D. Rumsky et al). Namely, it is reported that, according to said ingot-annealing method, the uniformity of various characteristics, for example, the threshold voltage being important for IC is attained (Appl. Phys. Lett., 44, '84, p. 410, Miyazawa et al).

This ingot-annealing method is carried out in a way that, after heating the crystal for many hours, it is cooled at a rate as slow as 50° C./hour in order not to cause strains in the crystal.

For the substrates to be used for LSI and IC, high resistivity is also important together with the uniformity of characteristics. This is so since, if the resistivity is high, the condition of separation between elemnts becomes good and the degree of integration can also be made large. With the substrate given the ingot-annealing, however, the uniformity of characteristics is improved as described above, but the resistivity decreases resulting in causing a problem in the leakage current between elements or that from the active layer to the substrate.

As a result of extensive investigations in view of this situation, a method of manufacturing the substrate of GaAs compound semiconductor capable of raising the resistivity of substrate has been developed by the invention.

SUMMARY OF THE INVENTION

The invention is characterized in that, after a crystal of GaAs compound semiconductor obtained by the liquid encapsulated Czochralski method is annealed in the form of an ingot, gradually cooled to the room temperature (hereinafter referred to as annealing) and cut off in the form of wafer, the re-heating treatment consisting of heating to a temperature of not lower than 700° C., rapid cooling from the temperature of not lower than 700° C. to a temperature of not higher than 400° C. within 30 minutes and successive cooling to the room temperature (hereinafter referred to as re-heating treatment) is given to the wafer, and then mirror polishing is performed.

DETAILED DESCRIPTION OF THE INVENTION

In the invention, the reason why the crystal of GaAs compound semiconductor obtained by the LEC method is first annealed in the form of ingot is to obtain uniformity in the distribution of characteristics in the ingot. Specifically, the ingot is annealed at an usual temperature of 700° to 1100° C. for 2 to 48 hours and thereafter gradually cooled (about 50° C./hour) to the room temperature. Here, the reason for gradually cooling to room temperature is to prevent cracking of the wafer when cutting it off or later.

Secondly, the reason why the crystal is cut off in the form of a wafer before the re-heating treatment is to prevent the strains in the crystal from occurring by the homogeneous cooling at the time of rapid cooling. Thirdly, the reason whey said cut wafer is heated again to not lower than 700° C. and rapidly cooled from that temperature to not higher than 400° C. within 30 minutes is to raise the resistivity of the substrate.

According to the results investigated by the inventors, in the ingot-annealed crystal of GaAs compound semiconductor, the donors are generated in large quantities and the resistivity is lowered. This is due to the fact that a large number of donors are generated during the gradual cooling ranging from 700° C. to 400° C. in the cooling process after the annealing. However, by re-heating this crystal of wafer and by rapidly cooling (cooling from a temperature of not lower than 700° C. to not higher than 400° C. within 30 minutes) it as described above, the resistivity can be raised. This is due to the donors generated during ingot-annealing becoming extinct by said re-heating treatment. Namely, the extinction of donors generated during the ingot-annealing by re-heating to 700° C. or higher and the prevention of donors from re-generation by rapid cooling from 700° C. or higher to 400° C. or lower within 30 minutes permit to raise the resistivity of the crystal of wafer. Besides, the re-heating time at not lower than 700° C. is preferable to be within a range of 1 to 60 minutes. Moreover, the lowering of temperature from not higher than 400° C. to room temperature is made by gradual cooling. In this range, the resistivity of the crystal of wafer is not particularly influenced by the cooling rate, but the gradual cooling is desirable from the viewpoint of the uniformity of internal strains.

By giving such re-heating treatment, the crystal high in resistivity as a whole can be obtained leaving the uniformity of characteristics obtained by the ingot-annealing as it is.

The invention will be illustrated based on an example.

EXAMPLE

Figure 1:
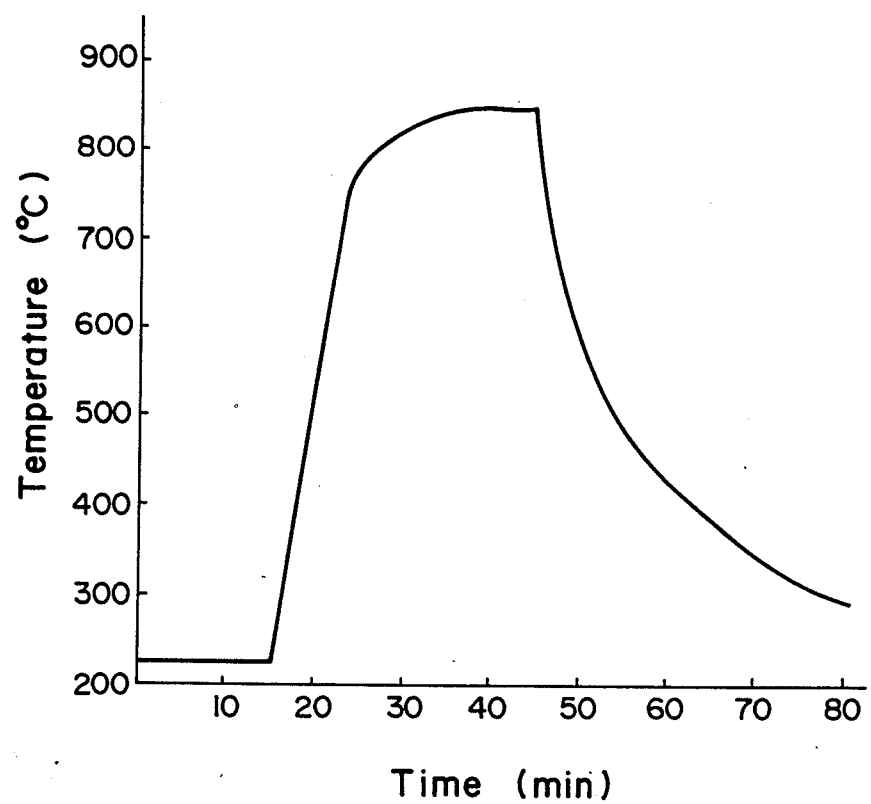
FIG. 1 is a graph showing a temperature curve of re-heating treatment carried out in an example of the invention.

After an ingot of GaAs single crystal (concentration of carbon: not more than $4 \times 10^{14}$ cm$^{-3}$) obtained by the LEC method was annealed, it was cut off in the form of wafer, and said wafer was submitted to the re-heating treatment in a flow of nitrogen according to a temperature curve as shown in FIG. 1 in such a way that, after re-heating at 850° C. for 10 minutes, the wafer is rapidly cooled from this temperature to 400° C. or lower during about 20 minutes and thereafter gradually cooled to room temperature.

Figure 2:
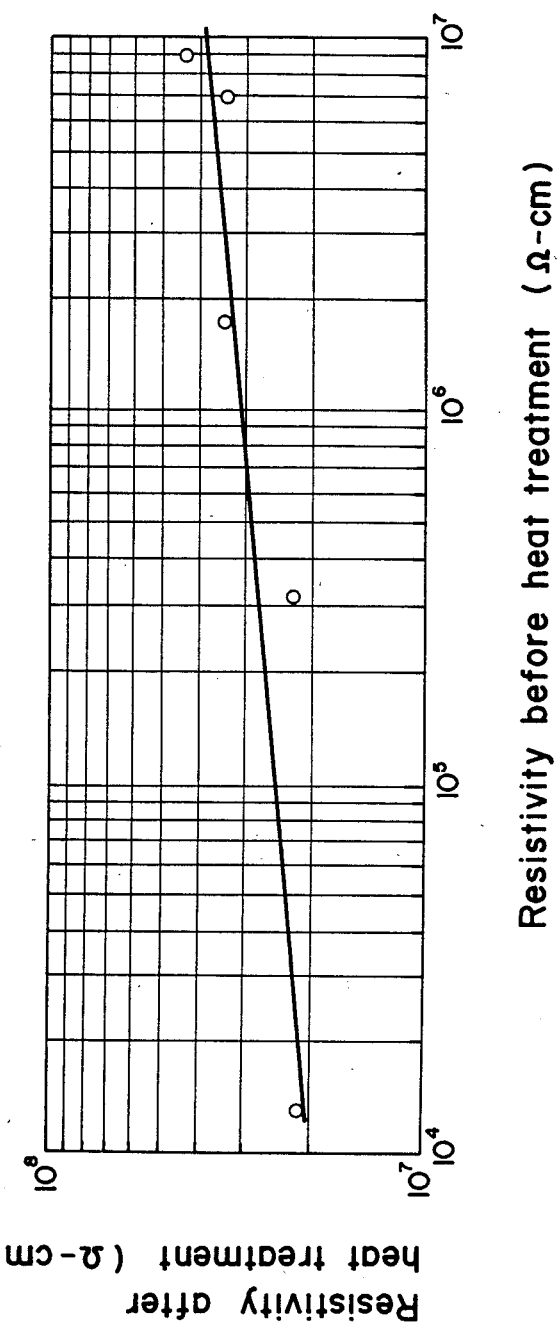
FIG. 2 is an actual diagram showing the resistivities before and after the re-heating treatment.

In order to clarify the effect of such re-heating treatment, the resistivity of wafers after the annealing and before the re-heating treatment was measured, and said re-heating treatment was given to the wafers having various resistivities and the resistivity after the re-heating treatment was measured. These results are shown in FIG. 2. The measurement of resistivity after the re-heating treatment was made after etching the surface of wafer by 50 μm.

As evident from FIG. 2, even such wafers having had a resistivity of less than $10^7$ Ω.cm before the re-heating treatment all showed a resistivity of more than $10^7$ Ω.cm after the re-heating treatment to become semi-insulating.

Figure 3:
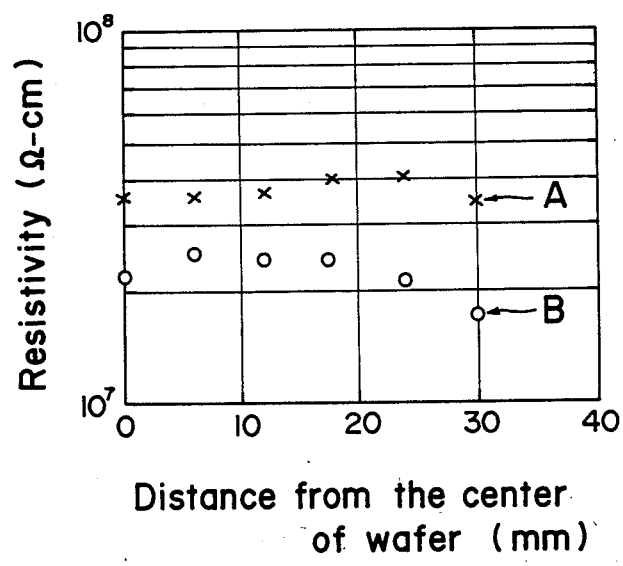
FIG. 3 is an actual diagram showing the distribution of resistivities on the wafer before and after the re-heating treatment wherein A indicates the distribution of resistivities after the annealing and successive re-heating treatment and B indicates that after the annealing and before the re-heating treatment.

Moreover, of the wafer after the annealing and before the re-heating treatment and further of the wafer after given the re-heating treatment, the distribution of resistivities in the radial direction was investigated, the results of which are shown in FIG. 3.

As evident from FIG. 3, in the distribution of resistivities on the wafer after the annealing and successive re-heating treatment (A), it is seen that the uniformity is not lost, rather improved, by the re-heating treatment compared with that on the wafer after the annealing and before the re-heating treatment (B), which was kept quite as annealed, and further that the resistivity of wafer after the re-heating treatment is made higher at any location.

As described, in accordance with the invention, the resistivity can be raised keeping the uniformity of characteristics in the crystal of GaAs compound semiconductor. For this reason and others, the invention exerts a remarkable effect industrially.

What is claimed is:

1. A method of manufacturing a substrate of a GaAs compound semiconductor, comprising annealing an ingot of a crystal of GaAs compound semiconductor obtained by the liquid encapsulated Czochralski method, gradually cooling the annealed ingot to room temperature, cutting off a wafer therefrom, reheating said wafer by heating it to a temperature of not lower than 700° C., rapidly cooling the wafer from the temperature of not lower than 700° C. to a temperature of not higher than 400° C. within 30 minutes and successively cooling the wafer to room temperature.

2. The method of manufacturing the substrate of GaAs compound semiconductor according to claim 1, wherein the reheating of the wafer is carried out in an atmosphere of nitrogen gas.

3. The method of manufacturing the substrate of GaAs compound semiconductor according to claim 1, wherein after cooling to room temperature the wafer is mirror polished.

* * * * *